(12) United States Patent
Iwase et al.

(10) Patent No.: US 8,572,522 B2
(45) Date of Patent: Oct. 29, 2013

(54) ILLUMINATION-SOURCE SHAPE DEFINITION IN OPTICAL LITHOGRAPHY

(75) Inventors: Kazuya Iwase, Tokyo (JP); Peter De Bisschop, Leuven (BE)

(73) Assignees: IMEC, Leuven (BE); Sony Corporation, Tokyo (JP); ASML Netherlands BV, Veldhoven (NL)

( * ) Notice: Subject to any disclaimer, the term of this patent is extended or adjusted under 35 U.S.C. 154(b) by 0 days.

(21) Appl. No.: 13/618,562

(22) Filed: Sep. 14, 2012

(65) Prior Publication Data

US 2013/0074017 A1 Mar. 21, 2013

(30) Foreign Application Priority Data

Sep. 16, 2011 (EP) ..................................... 11181654

(51) Int. Cl.
*G06F 17/50* (2006.01)
(52) U.S. Cl.
USPC ................................ 716/54; 716/53; 716/132
(58) Field of Classification Search
None
See application file for complete search history.

(56) References Cited

U.S. PATENT DOCUMENTS

| | | | | |
|---|---|---|---|---|
| 7,275,225 | B2 * | 9/2007 | Kamat | 716/51 |
| 8,438,508 | B2 * | 5/2013 | Liu | 716/54 |
| 2002/0192570 | A1 | 12/2002 | Smith | |
| 2003/0064298 | A1 | 4/2003 | Broeke et al. | |
| 2003/0082463 | A1 | 5/2003 | Laidig et al. | |
| 2004/0156030 | A1 | 8/2004 | Hansen | |
| 2004/0170905 | A1 | 9/2004 | Liebmann et al. | |
| 2004/0172610 | A1 | 9/2004 | Liebmann et al. | |
| 2005/0003305 | A1 | 1/2005 | Hashimoto et al. | |
| 2005/0018164 | A1 | 1/2005 | Hansen | |
| 2005/0028129 | A1 | 2/2005 | Hsu et al. | |
| 2005/0287483 | A1 | 12/2005 | Lercel et al. | |
| 2006/0070018 | A1 | 3/2006 | Semmler | |
| 2006/0107249 | A1 | 5/2006 | Zhang et al. | |
| 2007/0013888 | A1 | 1/2007 | Flagello et al. | |
| 2007/0238038 | A1 | 10/2007 | Fukuhara | |
| 2008/0020296 | A1 | 1/2008 | Hsu et al. | |
| 2009/0081563 | A1 | 3/2009 | Wang et al. | |
| 2009/0092926 | A1 | 4/2009 | Gutmann et al. | |
| 2009/0220871 | A1 | 9/2009 | Van Dijk | |
| 2009/0258302 | A1 | 10/2009 | Ho et al. | |
| 2010/0315614 | A1 | 12/2010 | Hansen | |

(Continued)

FOREIGN PATENT DOCUMENTS

| | | |
|---|---|---|
| JP | 2007-266155 | 10/2007 |
| WO | 2010059954 | 5/2010 |

OTHER PUBLICATIONS

J. Bekaert et al., "Freeform illumination sources: An experimental study of source-mask optimization for 22 nm SRAM cells," Optical Microlithography XXIII, Proc. of SPIE vol. 7640, 2010 SPIE, 12 pages.*

(Continued)

*Primary Examiner* — Leigh Garbowski
(74) *Attorney, Agent, or Firm* — McDonnell Boehnen Hulbert & Berghoff LLP (57) ABSTRACT

A method and system are described for determining lithographic processing conditions for a lithographic process. After obtaining input, a first optimization is made for illumination source and mask design under conditions of allowing non-rectangular sub-resolution assist features. Thereafter, mask design is optimized in one or more further optimizations for which only rectangular sub-resolution assist features are allowed. The latter results in good lithographic processing while limiting the complexity of the mask design.

12 Claims, 6 Drawing Sheets

(56) References Cited

U.S. PATENT DOCUMENTS

2010/0325591 A1 12/2010 Lippincott et al.
2011/0099526 A1 4/2011 Liu
2011/0116067 A1 5/2011 Ye et al.
2011/0230999 A1* 9/2011 Chen et al. .................. 700/105

OTHER PUBLICATIONS

P. De Bisschop et al., "Joint-Optimization of Layout and Litho for SRAM and Logic towards the 20 nm node, using 193i," Optical Microlithography XXIV, Proc. of SPIE vol. 7973, 2011 SPIE, 18 pages.*
E. Hendrickx et al., "Hyper-NA imaging of 45nm node random CH layouts using inverse lithography," Optical Microlithography XXI, Proc. of SPIE vol. 6924, 2008 SPIE, 10 pages.*
S. Hsu et al., "An Innovative Source-Mask co-Optimization (SMO) Method for Extending Low k1 Imaging," Lithography Asia 2008, Proc. of SPIE vol. 7140, 10 pages.*
B.-G. Kim et al., "Trade-off between Inverse Lithography Mask Complexity and Lithographic Performance," Photomask and Next-Generation Lithography Mask Technology XVI, 2009 SPIE, Proc. of SPIE vol. 7379, 11 pages.*
M. Mulder et al., "Performance of FlexRay, a fully programmable Illumination system for generation of Freeform Sources on high NA immersion systems," Optical Microlithography XXIII, Proc. of SPIE vol. 7640, 2010 SPIE, 10 pages.*
S. Nagahara et al., "SMO for 28 nm logic device and beyond: Impact of source and mask complexity on lithography performance," Optical Microlithography XXIII, Proc. of SPIE vol. 7640, 2010 SPIE, 12 pages.*
S. Nagahara et al., "SMO mask requirements for low k1 lithography," Photomask Technology 2010, Proc. of SPIE vol. 7823, 12 pages.*
R. Socha et al., "Simultaneous Source Mask Optimization (SMO)," Photomask and Next-Generation Lithography Mask Technology XII, 2005 Proceedings of SPIE vol. 5853, pp. 180-193.*
T. Takigawa et al., "Extension of Optical Lithography by Mask-Litho Integration with Computational Lithography," Photomask and Next-Generation Lithography Mask Technology XVII, 2010 SPIE, Proc. of SPIE vol. 7748, 11 pages.*
M.-C. Tsai et al., "Full-chip source and mask optimization," optical Microlithography XXIV, 2011 SPIE, Proc. of SPIE vol. 7973, 11 pages.*

* cited by examiner

ILLUMINATION-SOURCE SHAPE DEFINITION IN OPTICAL LITHOGRAPHY

CROSS REFERENCE TO RELATED APPLICATIONS

Pursuant to the provisions of 35 U.S.C. §119(b), this application claims priority to EP11181654.2 filed Sep. 16, 2011, the entire contents of which are incorporated herein by reference.

FIELD

The invention relates to the field of optical lithography. More specifically it relates to methods and systems for optimizing lithographic processing such as optimizing source illumination, threshold and mask to be used for lithographic processing.

BACKGROUND

Optical lithography is one of the technologies that are being used in the production of microchips. It uses a 'reticle', also called 'photomask' or 'mask' to form certain patterns in a 'photo-resist layer' that is coated on a 'wafer'. This mask contains a pattern that, when an image of it is projected on the wafer, generates the desired pattern in this photoresist layer, after it has been chemically developed. This projected image is formed on the photoresist layer by illuminating the mask with a certain wavelength and light-source shape. The light passing through the mask is then captured by the projection lens of the lithography exposure tool, and this lens forms an image of the mask pattern in the photoresist layer. The mask itself consists of an optically-transparent plate on which patterns have been created at one side: these patterns consist of polygons in which the optical-transmission properties of the mask are modified with respect to the 'unpatterned areas'. As an example, these polygon-shaped mask patterns might consist of a thin layer that absorbs or attenuated the light that passes through them.

The above basic concept for optical-projection-lithography is however complicated by two elements. The shapes in the image that is formed on the wafer, is never an identical copy of the shape of the patterns on the mask, and the difference between the two has become larger as the 'technology node' for which the lithography step is being used becomes more advanced, that is, as the pattern size and pattern density that need to be generated are becoming respectively smaller and denser such as for example below the 20 nm node. This effect of the difference between mask- and projected-image-pattern is called the 'optical proximity effect'.

For many years, this effect has been dealt with by applying a so-called 'optical proximity correction' (OPC) to the mask pattern: the mask pattern is intentionally made different from the image that one wants to form on the wafer, but in such a way that its projected image becomes closer to the desired wafer pattern. This modification in general implies that the shape of the mask patterns (polygons) is made different from the desired printed shapes in some appropriate way, but it can also imply adding additional polygons to the mask pattern that are not supposed to form printing images on the wafer but somehow improve the process latitudes (see next bullet) of the polygons that are supposed to print. These 'extra' mask polygons are often called 'assist mask features', or 'assist features'. OPC has been a standard technology for many years now, and several companies offer software that generates the optical proximity corrected mask pattern, if the intended wafer pattern is given, together with enough details on the way the mask will be exposed in the lithography tool.

The second element that makes optical-projection-lithography more complicated is that the fidelity of the wafer pattern is also affected by the presence of (to a certain extent unavoidable) imperfections in the lithographic process, a number of them being listed here. The printed pattern shape depends on the amount of light that is being used to generated the images on the wafer, the so-called 'exposure dose' or 'dose'. As it is in general not possible to expose exactly at the ideal dose, e.g., due to unavoidable machine- or operator-errors, lithographers aim to work under conditions where they have a sufficient amount of 'exposure latitude (EL)', that is conditions under which a certain offset from the ideal dose (usually expressed as a percentage of the dose itself) can be tolerated. The lithographic projection lens forming the image has a so-called 'best-focus plane', i.e., a certain plane in space where the image is most 'sharp' and hence closest to the intended image. If the wafer is not ideally located with respect to this best-focus plane, one says that the wafer is 'out-of-focus'. As it is in general not possible to expose wafers exactly in-focus, e.g., due to unavoidable machine- or operator-errors, lithographers aim to work under conditions where they have a sufficient amount of 'depth-of-focus (DOF)', that is conditions under which a certain offset from the ideal focus plane (usually expressed by saying how many nanometer the actual wafer plane is away from the ideal plane) can be tolerated. The mask patterns as generated by, e.g., the above mentioned OPC-software can in general not be perfectly realized on the actual photo-mask that is being used in the lithographic process: usually there are 'mask errors', i.e., the mask patterns deviate either in size or shape (or both) from the desired mask pattern. Any deviation from the desired mask pattern ('mask error') also leads to a deviation of the wafer pattern. As it is in general not possible to avoid mask errors, lithographers aim to work in conditions under which some amount of mask error can be tolerated.

Typically, one needs to find lithographic-process conditions under which enough EL, DOF and tolerance against mask errors is realized. The actual performance of a lithographic process with respect to the mentioned tolerances is often quantified in a metric that is called the 'critical dimension uniformity', abbreviated as CDU (expressed in nanometer). This metric expresses how much the dimension of a certain structure in the wafer image will actually vary (e.g., within a printed wafer or from wafer to wafer) due to process variations such as this exposure focus or dose or actual mask errors. Optimization of the lithographic process conditions can then be expressed as a minimization of this CDU metric. An important element therein, although not being the only element, is the selection of the illumination-source shape used in the lithographic exposure tool.

The above mentioned two complications are nowadays often handled by performing a so-called source-mask optimization (usually abbreviated as 'SMO'). This is a computational process in which the illumination source and the OPCed mask are varied simultaneously in order to find the source-mask combination that offers the best possible or at least sufficient tolerances (also called 'process margins') for dose, focus and/or mask error. Several software companies offer automated software to do such an SMO calculation, if the desired wafer image is given, together with other inputs such as the desired process margins and certain parameters that define limitations on the mask complexity that is allowed by the user.

These mask complexity limitations constitute a trade-off between maximizing the lithographic process latitudes and cost. This can be understood as follows. If a calculation is made of what the patterns on the mask should ideally look like to generate an image that is as close as possible to the requested image, the resulting mask patterns are usually extremely complex, which means that the shape of the mask polygons that are intended to generate a printing image as well as the amount, density and shape of the assist-features is very complex. Such complex masks, if at all manufacturable, would be very expensive, as the mask cost increases as the number of polygons that need to be created increases, or if the shape of the individual polygons becomes more complex. Furthermore, using arbitrarily shaped assist features would result in a very large mask file, being the file that describes the exact shape of all the patterns on the mask for which the industry uses a standard file format that is called a gds or gds2 file. Therefore, both OPC- and SMO-software have a number of numerical parameters that influence (limit) the complexity of the solution that the user is willing to accept, and for which the user of the software has to choose numerical value or settings he thinks are appropriate.

The actual complexity of the assist polygons that appear in the final mask solution is further influenced by the values of a set of input parameters for the SMO calculation that are called 'mask-rule check' or MRC parameters. The actual values for these parameters (that have to be set by the person who runs the calculation) set limits to the allowed complexity of each individual mask polygon. As an example, these MRC parameters set minimum values to the allowed segment length of mask polygons. An MRC parameter set that allows very complex shapes would be called 'aggressive': the printed image shape with such an aggressive set of MRC input parameters would in general be closer to the desired ideal image, but the resulting mask might be non-manufacturable or very expensive. This is why in general people prefer to run SMO software with more 'moderate MRC' input parameters, leading to a less perfect printed image but outputting a less complex and hence more manufacturable or less expensive mask.

The decision to allow only rectangular assists limits the mask cost, but it also often leads to smaller process latitudes: many cases are known where the lithographic process tolerances improve if non-rectangular assist-features are allowed as compared to the case where only rectangular assists are allowed. More aggressive input MRC parameters usually also lead to larger process margins.

SUMMARY

It is an object of embodiments of the present invention to provide good methods and systems for determining lithographic processing conditions.

It is an advantage of embodiments of the present invention that lithographic processing conditions can be determined for providing a lithographic process with a good depth of focus (DoF) performance while allowing low complexity of sub-resolution assist features in the mask used. It is an advantage of embodiments of the present invention that the manufacturing effort and economical cost for manufacturing masks can be low, while still obtaining a lithographic process with a good DoF performance.

It is an advantage of embodiments of the present invention that lithographic processing conditions can be determined for a lithographic process wherein the mask complexity is low or limited (i.e., for example only rectangular shaped sub-resolution assist features being presence), while the lithographic process allows obtaining a similar or the same critical dimension uniformity (CDU) as would be the case if also non-rectangular shaped sub-resolution features would have be allowed in the mask.

It is an advantage of embodiments of the present invention that the size of the mask file, defining the mask features and the sub-resolution assist features used, can be limited, while still obtaining good lithographic processing.

The above objective is accomplished by a method and device according to the present invention.

The present invention relates to a method for determining lithographic processing conditions for a lithographic process, the method comprising obtaining characteristics of an illumination source and a mask design, the mask design comprising a lithography pattern, performing a first optimization for combined optimizing of the illumination source characteristics and the mask design characteristics for the lithographic process, whereby for the first optimization non-rectangular sub-resolution assist features for the mask are allowed, determining from the first optimization a set of optimized illumination source characteristics, performing one or more further optimizations for optimizing the mask design characteristics of the lithographic process, whereby for the one or more further optimizations the presence of non-rectangular sub-resolution assist features for the mask design is substantially excluded and whereby the one or more further optimizations takes into account the set of optimized illumination source characteristics, and determining from the one or more further optimizations a set of optimized mask design characteristics substantially excluding non-rectangular sub-resolution assist features.

It has surprisingly been found that optimizing the mask design characteristics using restricted mask design settings not allowing non-rectangular shaped sub-resolution assist features while using source-illumination conditions determined using non- or less restricted mask design settings allowing non-rectangular shaped sub-resolution assist features, provides lithographic processing conditions for a good lithographic process, e.g., good DoF, good CDU, whereas the mask design complexity is limited. Where reference is made to substantially excluding non-rectangular sub-resolution assist features, this may refer to using only rectangular sub-resolution assist features. The method may be computer-implemented.

The one or more further optimizations may be performed taking into account mask rule check settings expressing at least that the most complex mask design feature allowed in the one or more further optimizations is less complex than the most complex mask design feature allowed in the first optimization. It is an advantage of at least some embodiments of the present invention that not only the sub-resolution assist features may be less complex in the final mask design but also the other mask features may be less complex in the final mask design, compared to mask features in a mask design made using conventional mask optimization for good lithographic processing.

The first optimization may be performed on an optimization clip, being only a part of the mask design. It is an advantage of at least some embodiments of the present invention that optimization can be performed on only a small part of the mask, thus allowing efficient processing with limited computing power.

The one or more optimizations may comprise optimizing a threshold for the lithographic processing.

Performing the one or more optimizations may comprise performing a second optimization for optimizing of the threshold and the mask design characteristics of the lithographic process, whereby for the second optimization the presence of non-rectangular sub-resolution assist features for the mask is substantially excluded and whereby the second optimization takes into account the set of optimized illumination source characteristics, and performing a third optimization for optimizing the mask design characteristics for the lithographic process, whereby for the third optimization the presence of non-rectangular sub-resolution assist features for the mask is substantially excluded and whereby the third optimization takes into account the set of optimized illumination source characteristics determined from the first optimization and an optimized threshold determined from the second optimization.

It is an advantage of at least some embodiments of the present invention that the illumination source, the threshold and the mask characteristics to be selected can be optimized in different optimization steps, allowing to optimize each parameter with its own assist- and mask rule check settings. It is an advantage of at least some embodiments that the use of different assist- and mask rule check settings can allow to optimize the illumination source, the threshold and the mask characteristics such that a good DoF and/or CDU can be obtained using the lithographic processing and simultaneously a mask with limited complexity can be used for lithographic processing.

Performing the second optimization may be applied for an optimization clip, being only a part of the mask design. It is an advantage of at least some embodiments of the present invention that optimization can be performed on only a small part of the mask, thus allowing efficient processing with limited computing power.

Performing the third optimization may be applied for the full mask design. It is an advantage of at least some embodiments of the present invention that mask features can be determined for the full mask can be obtained.

The lithographic process may comprise multiple patterning steps for patterning different portions of a pattern to be processed. Embodiments of the present invention may be especially suitable for multiple patterning lithographic processing as in multiple patterning as the sub-patterns typically have a wide spacing between the features. In other words, using multiple patterning lithographic processing, there is more frequent occurrence of isolated patterns. As this has intrinsically negative impact on the depth of focus margin and the CD (critical dimension) variation, strategies for improving depth of focus and CD uniformity as obtained with at least some embodiments of the present invention are beneficial for the multiple patterning technique.

For performing each or any of the first or the one or more further optimizations a source-mask optimization algorithm may be used based on any of a full resist model or an aerial image model.

The present invention also relates to a system for determining lithographic processing conditions for a lithographic process, the system comprising an input means for obtaining characteristics of an illumination source and a mask design, the mask design comprising a lithography pattern and sub-resolution assist features, a processing means programmed for performing a first optimization for combined optimizing of the illumination source characteristics and the mask design characteristics for the lithographic process, whereby for the first optimization non-rectangular sub-resolution assist features for the mask are allowed, determining from the first optimization a set of optimized illumination source characteristics, performing one or more further optimizations for optimizing the mask design characteristics of the lithographic process, whereby for the one or more further optimizations the presence of non-rectangular sub-resolution assist features for the mask is substantially excluded and whereby the one or more further optimizations takes into account the set of optimized illumination source characteristics, and determining from the one or more further optimizations a set of optimized mask design characteristics substantially excluding non-rectangular sub-resolution assist features.

The processing means may be adapted for performing a second optimization for optimizing of the threshold and the mask design characteristics of the lithographic process, whereby for the second optimization the presence of non-rectangular sub-resolution assist features for the mask is substantially excluded and whereby the second optimization takes into account the set of optimized illumination source characteristics, and a third optimization for optimizing the mask design characteristics for the lithographic process, whereby for the third optimization the presence of non-rectangular sub-resolution assist features for the mask is substantially excluded and whereby the third optimization takes into account the set of optimized illumination source characteristics determined from the first optimization and an optimized threshold determined from the second optimization.

The system may be implemented as a computer program product for, when executing on a processing means, carrying out one of the methods as described above.

The present invention also relates to a data carrier for storing a computer program product for, when executing on a processing means, carrying out one of the methods as described above.

The present invention also relates to the transmission of a computer program product for, when executing on a processing means, carrying out one of the methods as described above.

The present invention furthermore relates to a kit of parts for use in lithographic processing, the kit of parts comprising a carrier comprising illumination source characteristics determined using a method as described above, and a mask according to a mask design determined using the same method.

The present invention furthermore relates to an electronic device, the electronic device comprising at least one patterned layer, the patterned layer being made using lithographic processing according to lithographic processing conditions determined using a method as described above.

The present invention also relates to a method of manufacturing an electronic device, the method comprising determining a set of lithographic processing conditions comprising illumination source characteristics and mask characteristics using a method for determining lithographic processing conditions as described above, and exposing a photoresist layer on a semiconductor substrate using the lithographic processing conditions for forming the electronic device.

It is an advantage of embodiments of the present invention that lithographic processing conditions can be determined for providing a lithographic process with a good depth of focus performance Particular and preferred aspects of the invention are set out in the accompanying independent and dependent claims. Features from the dependent claims may be combined with features of the independent claims and with features of other dependent claims as appropriate and not merely as explicitly set out in the claims.

These and other aspects of the invention will be apparent from and elucidated with reference to the embodiment(s) described hereinafter.

The drawings are only schematic and are non-limiting. In the drawings, the size of some of the elements may be exaggerated and not drawn on scale for illustrative purposes.

Any reference signs in the claims shall not be construed as limiting the scope.

In the different drawings, the same reference signs refer to the same or analogous elements.

DETAILED DESCRIPTION

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the invention.

Furthermore, the terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

Moreover, the terms top, under and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

In the description provided herein, numerous specific details are set forth. However, it is understood that embodiments of the invention may be practiced without these specific details. In other instances, well-known methods, structures and techniques have not been shown in detail in order not to obscure an understanding of this description.

Where in experiment discussed below or embodiments according to the present invention reference is made to sub-resolution assist features (SRAF), reference is made to features that are added to a mask and that allow to correct for optical proximity errors introduced if a mask literally based on the features to be patterned would be applied. Typically two types of assist features exist. A first type is the rectangular sub-resolution assist features which are generally rectangular in shape. A second type is non-rectangular sub-resolution assist features (SRAF) which comprise, besides optionally rectangular features, also non-rectangular shaped SRAF portions. These are also referred to as free-from SRAF.

Figure 1:
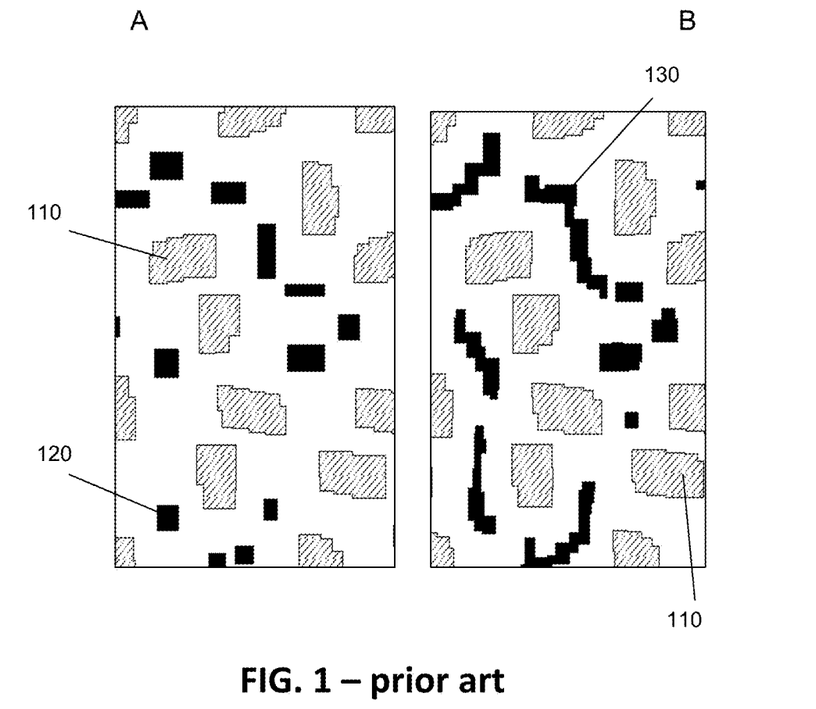
FIG. 1—prior art illustrates the rectangular (part A) and non-rectangular (part B) sub-resolution assist features. Such features can also be advantageously used in embodiments of the present invention.
Figure 2:
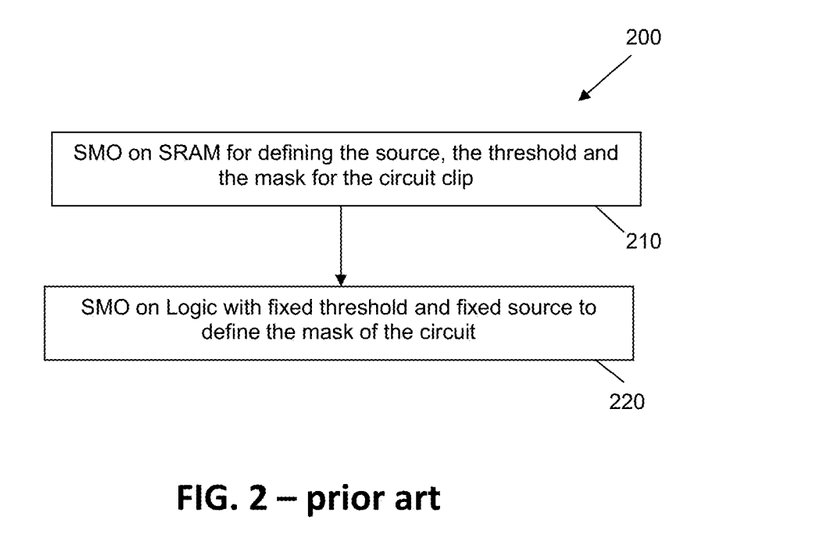
FIG. 2—prior art illustrates a conventional source-mask optimization flow, as known from prior art.

In general, assist features can be objects of any shape, for example polygons with an arbitrary high number of vertex points. In some embodiments, such non-rectangular SRAF may be limited to polygonal shaped SRAF and even to polygonal shaped SRAF wherein the angles used are limited to 0°, 90°, 180° or 270°, embodiments of the present invention not being limited thereby. By way of illustration, embodiments of the present invention not being limited thereto, an illustration of rectangular SRAF correction (part A) and non-rectangular SRAF (part B) correction for double patterning is shown in FIG. 1. The black portions indicate the sub-resolution assist features whereas the hatched portions indicate the original pattern features. As known, the use of non-rectangular SRAF in double patterning substantially increases the depth of focus (DoF), but also substantially increases the mask file size (GDS).

Where in embodiments of the present invention or experiments, reference is made to source-mask optimization (SMO) reference is made to a technique for optimizing the irradiation source and the mask. The optimization may have different effects on different edges and features of the irradiation source. It may for example have an effect on the source shape or the irradiation pattern. It may for example also include the use of pupils to restrict the source illumination to a selected pattern of radiation. Optimizing the mask may have an effect on different features and edges of the mask. It may for example include shifting or biasing edge positions or line widths as well as application of assist features that are not intended to print themselves but will affect the properties of an associated pattern feature to be printed. The SMO typically also includes optimization of the threshold. Where in embodiments of the present invention reference is made to the threshold, reference is made to the irradiation intensity or dose used for irradiating and above which the irradiated photoresist will be altered so that it can lead to formation of a pattern. The threshold used directly influences the critical dimension that can be obtained.

Where in embodiments according to the present invention reference is made to a conventional SMO flow or a standard SMO flow, reference is made to SMO optimization typically performed according to the method as shown in FIG. 2. In FIG. 2 essential parts of such a conventional SMO flow 200 are shown. In a first step 210, source mask optimization is implemented on a circuit clip, e.g., an SRAM cell, so as to define the source and the mask shape. The pattern used in this step is not necessary limited to one circuit clip such as an SRAM cell, but other clips, e.g., from a logic circuit block or a combination thereof also can be used. In the next step 220, mask optimization (MO) is performed on logic pattern, this part being essentially corresponding with the optical proximity correction (OPC). The outcome of the mask shape should be taken into consideration mask manufacturability. Therefore, typically the SMO and MO optimization is performed under moderate mask restriction rules (MRC) and using rectangular SRAF, as for non-rectangular SRAF the GDS mask file size typically becomes very large. If a large GDS file size and a complex mask are not too restrictive, the conventional SMO flow also may be performed with more aggressive mask restriction rules and with non-rectangular SRAF.

In a first aspect, the present invention relates to a method for determining lithographic processing conditions for a lithographic process. The method is especially suitable for patterning of small patterns. The method may be advantageously be used in multiple patterning processing, such as for example in double patterning lithographic processing, although embodiments of the present invention are not limited thereto. It makes use of an algorithm for source-mask optimization (SMO).

Different algorithms for performing SMO are known in the art, and embodiments of the present invention can make use of each of such algorithm. An example of a SMO algorithm that can be used is described in international patent application WO2010/059954 A2, although embodiments of the present invention are not limited thereto. Algorithms for source mask optimization typically may make use of optical imaging model simulations. For example the SMO optimization may make use of an aerial image model or a full resist model, embodiments of the present invention not being limited by the particular model used.

Furthermore, embodiments of the present invention make use of different optimization steps. In each of the steps, the same or a different SMO algorithm may be used, making use of the same or a different optical imaging simulation model such as an aerial image model or a full resist model. For some SMO steps, the source conditions are fixed, e.g., determined in a previous step. In such cases the algorithm also may be referred to as a mask optimization algorithm (MO).

The method according to embodiments of the present invention comprises a step of obtaining characteristics of an illumination source and a mask design to be optimized. The mask design characteristics or mask design thereby comprise an initial pattern. The mask design characteristics may also comprise a set of sub-resolution assist features to be refined or these may be introduced during the optimization steps to be performed.

After obtaining the initial settings, a first optimization is performed for combined optimizing of the illumination source characteristics and the mask design characteristics for the lithographic process. According to embodiments of the present invention, this first optimization is performed such that non-rectangular sub-resolution assist features for the mask are allowed. As indicated above, a typical SMO algorithm may be used for this optimization, embodiments of the present invention not being limited thereto. For examples, the optimization may be based on a full resist model as well as on an aerial image model. The first optimization typically may be performed on an optimization clip, being only part of the mask design to be optimized, although embodiments of the present invention are not limited thereto. From this first optimization, a set of optimized illumination source characteristics as well as a set of optimized mask design characteristics is determined, but only the set of optimized illumination source characteristics is maintained and will be used further in the method.

Thereafter, a step of performing one or more further optimizations is performed, for optimizing the mask design characteristics of the lithographic process. This optimization may be performed in a single step or in different optimizations, e.g., if other parameters such as for example the threshold also are to be optimized. For these one or more further optimizations, the set of optimized illumination source characteristics as determined in the first optimization are used as fixed illumination source characteristics, without allowing further variation of these illumination source characteristics.

As indicated above, the algorithm used may be the same or a different algorithm as used in the first optimization. It may be an algorithm based on a full resist model as well as an algorithm based on an aerial image model. In the one or more further optimizations for optimizing the mask design characteristics, the presence of non-rectangular sub-resolution assist features for the mask design is substantially excluded.

Furthermore, the mask rule check settings may be set, such that less complex mask design features are allowed. These optimizations will result in a less complex mask design than obtained with the first optimization but surprisingly has the advantage of obtaining the good depth of focus (DoF) as would have been obtained when performing the optimization of illumination source and mask with non-rectangular sub-resolution assist features allowed.

Figure 3:
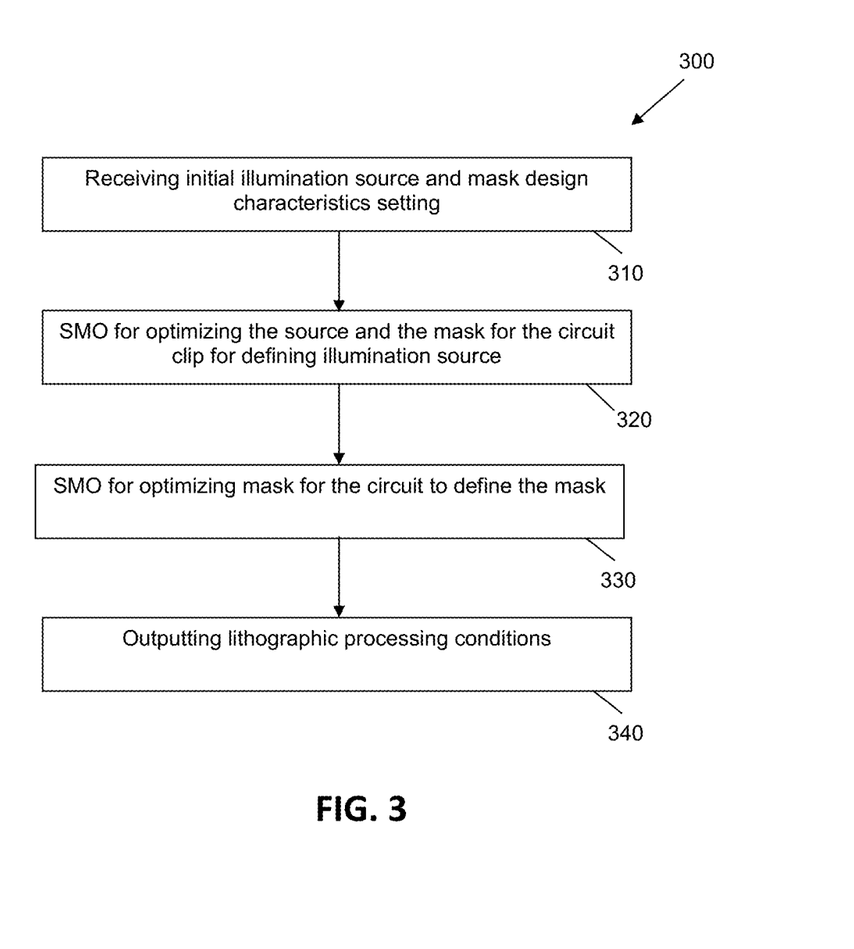
FIG. 3 illustrates a method for determining lithographic processing conditions according to an embodiment of the present invention.

From these one or more further optimizations, a set of optimized mask design characteristics is determined whereby for the mask design characteristics, non-rectangular sub-resolution assist features are substantially excluded. These one or more optimizations may be performed for the full mask design. By way of illustration, an exemplary method according to an embodiment of the present invention is illustrated in FIG. 3.

The exemplary method comprises obtaining 310 initial settings for the illumination source and the mask design. The separation between the optimization step for defining the source 320 and for defining the threshold and the mask 330 allows to use different conditions on the sub-resolution assist features, i.e., allows to define the source using mask characteristics allowing non-rectangular sub-resolution assist features and allows to define the mask characteristics and threshold using conditions not allowing non-rectangular sub-resolution assist features. As will be illustrated in experimental results below, this results in the advantage of obtaining lithographic process conditions resulting in good depth of focus while limiting the mask design complexity and mask design file size of the file storing the mask characteristics.

The method also may comprise outputting 340 the lithographic processing conditions as determined above via an output port, to a data carrier, by displaying or in any other means. The output provided are lithographic processing conditions comprising information regarding the illuminations source to be used during lithographic processing as well as a mask design for use in the lithographic processing.

Methods according to embodiments of the present invention advantageously are at least partially computer-implemented. For example, at least the optimization steps wherein the optimization algorithms are applied may be performed in a computer-implemented manner. In some embodiments, the method may be fully computer implemented.

In some embodiments, the one or more further optimizations also include optimization of the threshold for lithographic processing. The latter can be performed in a separate step or combined with the optimization step for the mask characteristics.

In one embodiment, optimization of the threshold and the mask design characteristics is performed in a single optimization step, following the optimization step for defining the illumination source characteristics. The latter then typically may be performed on the full mask design, i.e., for the full circuit, in order to obtain optimization of the full mask design. In such an embodiment the threshold and the mask design characteristics are defined in the same step. According to embodiments of the present invention, this is performed while excluding non-rectangular sub-resolution assist features.

In some embodiments, optimization of the threshold and the mask design is performed in separate optimization steps. The one or more optimization steps may therefore comprise a second optimization step for optimizing the threshold and the mask design excluding non-rectangular sub-resolution assist features and using the illumination source settings defined in the first optimization. From the second optimization step, at least the threshold setting is defined. Optionally also part of the mask design characteristics, e.g., those characteristics as obtained for a circuit clip being only part of the circuit mask design can be defined. The defined threshold and optionally also part of the mask design characteristics may then be used as fixed values for a third optimization step, wherein the mask design characteristics of the further mask design characteristics are determined for the full mask design, i.e., corresponding with the full circuit.

In particular embodiments of the present invention, besides excluding or allowing non-rectangular sub-resolution assist features, also mask rule check settings are selected differently between different optimizations. Mask-rule check settings or Mask-rule check parameters (MRC) are parameters that set limits to the allowed complexity of each individual mask polygon. As an example, these MRC parameters may set minimum values to the allowed segment length of mask polygons.

An MRC parameter set that allows very complex shapes would be called 'aggressive': the printed image shape with such an aggressive set of MRC input parameters would in general be closer to the desired ideal image, but the resulting mask is more complex and might be difficult to manufacture and/or very expensive. Moderate MRC settings lead to a less perfect printed image but outputting a less complex and hence more manufacturable or less expensive mask. According to embodiments of the present invention, the mask rule check settings may be selected such that at least the most complex mask design feature allowed in the one or more further optimizations is less complex than the most complex mask design feature allowed in the first optimization.

It is an advantage of embodiments according to the present invention that the threshold setting can be determined under the conditions wherein non-rectangular sub-resolution assist features are excluded, as this allows for a good DoF, better than the one obtained using a conventional SMO flow wherein non-rectangular sub-resolution assist features are excluded.

As also indicated above, the different optimizations steps may be performed using SMO optimization algorithms based on the same or on different simulation models, e.g. using an aerial image model or a full resist model.

Figure 4:
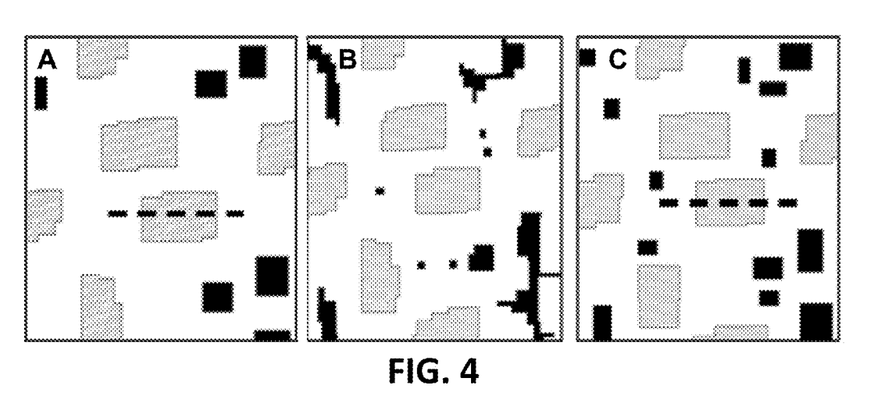
FIG. 4 illustrates comparative examples of SRAM patterns generated using a conventional flow with only rectangular SRAF allowed (flow A), using a conventional flow with non-rectangular SRAF allowed (flow B) and using an SMO flow according to an embodiment of the present invention (flow C).
Figure 5:
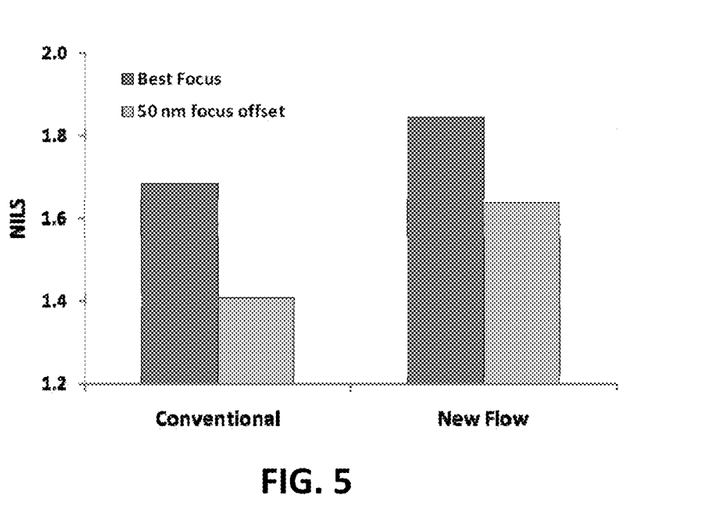
FIG. 5 illustrates the normalized image log slope (NILS) on the cut line indicated in the examples of SRAM patterns illustrated in FIG. 4 for the conventional flow with only rectangular SRAF allowed and for the flow according to an embodiment of the present invention.

FIG. 4 illustrates examples of SRAM patterns generated using a conventional flow with only rectangular SRAF allowed (flow A), using a conventional flow with non-rectangular SRAF allowed (flow B) and using an SMO flow according to an embodiment of the present invention (flow C). It can be seen that for the SMO flow according to an embodiment of the present invention, the number of SRAF is substantially larger than in flow A and that the layout of the SRAF is substantially more close to the conventional flow allowing non-rectangular SRAF (flow B). Comparison of the NILS for the conventional flow with only rectangular SRAF and for the flow according to an embodiment of the present invention indicates that there is a clear advantage on the NILS both for best focus and defocused conditions, as can be derived from FIG. 5. FIG. 5 illustrates the normalized image log slope (NILS) on the cut line indicated in FIG. 4.

Figure 6:
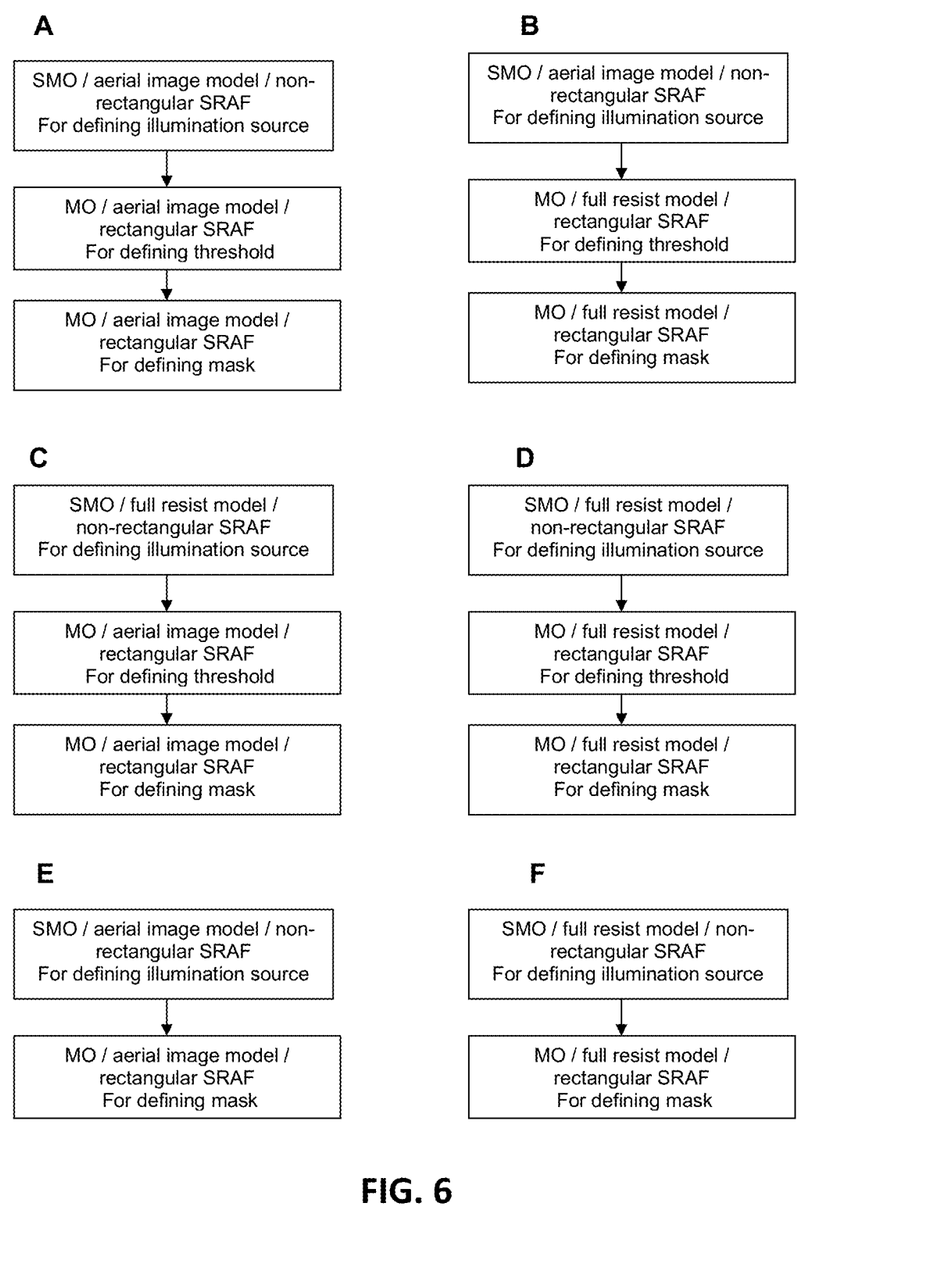
FIG. 6 illustrates a plurality of examples wherein the major steps of an SMO flow are indicated, according to embodiments of the present invention.

By way of illustration the major steps of a plurality of possible SMO flows are illustrated in FIG. 6, illustrating some examples of different possible flows according to embodiments of the present invention.

Figure 7:
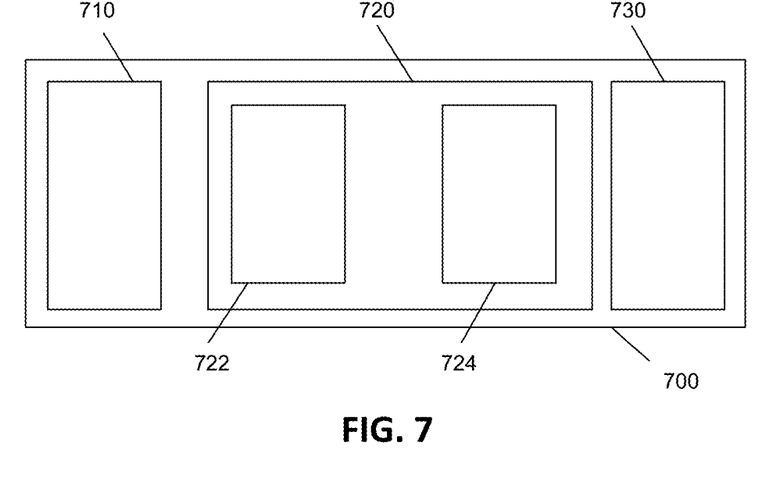
FIG. 7 illustrates a system for determining lithographic processing conditions according to an embodiment of the present invention.

In one aspect, the present invention also relates to a system for determining lithographic processing conditions for a lithographic process. The system may be especially suitable for performing a method according to the first aspect as described above, although embodiments are not limited thereto. The system may be computer implemented. Such a computer-implementation may be software implemented as well as hardware implemented or a combination thereof. By way of illustration, embodiments of the present invention not being limited thereto, an exemplary system according to an embodiment of the present invention is shown in FIG. 7, illustrating standard and optional features of such a system.

The system 700 comprises an input means 710 for obtaining characteristics of an illumination source and a mask design. The characteristics typically comprise a lithography pattern to be implemented. Sub resolution assist features may also already be defined for further optimization, or these may be introduced while optimizing, then not being part of the mask design characteristics. The input typically is obtained in electronic data format.

The system furthermore comprises a processing means. The processing means 720 thereby is programmed for performing a first optimization for combined optimizing of the illumination source characteristics and the mask design characteristics for the lithographic process. The processing means 720 furthermore is programmed for performing the first optimization such that non-rectangular sub-resolution assist features for the mask are allowed.

The processing means 720 also is programmed for determining from the first optimization a set of optimized illumination source characteristics.

The processing means 720 also is programmed for performing one or more additional optimizations for optimizing of the mask design characteristics of the lithographic process, whereby for the one or more further optimizations the presence of non-rectangular sub-resolution assist features for the mask is substantially excluded. The one or more further optimizations thereby take into account the set of optimized illumination source characteristics.

The processing means 720 also is programmed for determining from the one or more additional optimizations, a set of optimized mask design characteristics substantially excluding non-rectangular sub-resolution assist features. The processing means 720 furthermore may be adapted for taking into account different mask rule check settings for the different optimization steps.

For performing the above flow, the processing means 720 may comprise a controller 722 for timing the different actions. Furthermore, the processing means 720 also may comprise a SMO optimization module 724, which is adapted for performing SMO optimization taking into account particular settings provided, e.g., particular settings provided for particular simulations. These particular settings may be obtained from user-input or may be obtained from the controller 722. Such settings may be settings determining the degree of complexity of the mask, settings determining whether or not non-rectangular assist features are accepted, mask rule check settings expressing a degree of complexity allowed for the pattern features, etc. The SMO optimization module 724 may be any suitable source mask optimization module known to the person skilled in the art. It may be based on a particular model, such as for example an aerial image model or full resist model, or it may be adapted for selecting the model of interest.

The system furthermore comprises an output means 730 for putting out the lithographic processing conditions to be used. Such lithographic processing conditions typically comprise illumination source characteristics and mask design characteristics and can be outputted as electronic data, displayed, etc. Further system components may be any component adapted for performing one, more or part of steps of the method for determining lithographic processing conditions as described in the first aspect.

In another aspect, the present invention relates to a computer program product for, when executing on a processing means, carrying out one of the methods as described in the first aspect. The computer program product may be implemented on a processing system that includes at least one programmable processor coupled to a memory subsystem that includes at least one form of memory, e.g., RAM, ROM, and so forth. It is to be noted that the processor or processors may be a general purpose, or a special purpose processor, and may be for inclusion in a device, e.g., a chip that has other components that perform other functions. Thus, one or more aspects of embodiments of the present invention can be implemented in digital electronic circuitry, or in computer hardware, firmware, software, or in combinations of them.

The processor may be adapted for performing a method for determining lithographic processing conditions or may comprise instructions for performing such a method. The processor may include a storage subsystem that has at least one disk drive and/or CD-ROM drive and/or DVD drive. In some implementations, a display system, a keyboard, and a pointing device may be included as part of a user interface subsystem to provide for a user to manually input information. Ports for inputting and outputting data also may be included. More elements such as network connections, interfaces to various devices, and so forth, may be included. The various elements of the processing system may be coupled in various ways, including via a bus subsystem. The memory of the memory subsystem may at some time hold part or all of a set of instructions that when executed on the processing system implement the steps of the method embodiments described above.

The computer program product can be tangibly embodied in a carrier medium carrying machine-readable code for execution by a programmable processor. The present invention, thus, relates to a carrier medium carrying a computer program product that, when executed on computing means, provides instructions for executing determination of lithographic processing conditions according to any of the methods as described above. The term "carrier medium" refers to any medium that participates in providing instructions to a processor for execution.

Such a medium may take many forms, including but not limited to, non-volatile media, and transmission media. Non-volatile media includes, for example, optical or magnetic disks, such as a storage device that is part of mass storage. Common forms of computer readable media include, a CD-ROM, a DVD, a flexible disk or floppy disk, a tape, a memory chip or cartridge or any other medium from which a computer can read. Various forms of computer readable media may be involved in carrying one or more sequences of one or more instructions to a processor for execution. The computer program product can also be transmitted via a carrier wave in a network, such as a LAN, a WAN or the Internet. Transmission media can take the form of acoustic or light waves, such as those generated during radio wave and infrared data communications. Transmission media include coaxial cables, copper wire and fiber optics, including the wires that comprise a bus within a computer.

In a further aspect, the present invention also relates to a kit of parts for use in lithographic processing. The kit of parts comprises a carrier comprising data including illumination source characteristics determined using a method as described in the first aspect, as well as a mask according to a mask design determined using the same method.

In yet a further aspect, the present invention also relates to an electronic device, wherein the electronic device comprises at least one patterned layer, the patterned layer being made using lithographic processing according to lithographic processing conditions determined using a method as described in the first aspect.

In still another aspect, the present invention relates to a method for manufacturing an electronic device, the method comprising determining a set of lithographic processing conditions using a method as described in the first aspect and thereafter exposing a photoresist on a semiconductor substrate using the lithographic processing conditions for forming an electronic device. More particularly, the method may comprise obtaining characteristics of an illumination source and a mask design, the mask design comprising a lithography pattern and sub-resolution assist features, performing a first optimization for combined optimizing of the illumination source characteristics and the mask design characteristics for the lithographic process, whereby for the first optimization non-rectangular sub-resolution assist features for the mask are allowed, determining from the first optimization a set of optimized illumination source characteristics, performing one or more further optimizations for optimizing of the mask design characteristics of the lithographic process, whereby for the one or more further optimizations the presence of non-rectangular sub-resolution assist features for the mask design is substantially excluded and whereby the one or more further optimizations takes into account the set of optimized illumination source characteristics, and determining from the one or more further optimizations a set of optimized mask design characteristics substantially excluding non-rectangular sub-resolution assist features. The method furthermore comprises exposing a photoresist on a semiconductor substrate using the lithographic processing conditions thus obtained.

By way of illustration, embodiments of the present invention not being limited thereto, features and advantages of the above principles will be further illustrated by experimental results. The experiments were performed using source-mask optimization and model based sub-resolution assist feature placement using Tachyon-SMO™. The circuit patterns used in the experiments were a static random access memory (SRAM) cell and a logic standard cell. The former was a 6-transistor SRAM which is designed to realize high pattern density. The latter was a combination of 4-standard cells, flip-flop, full-adder, inverter and nand. Both of them were designed on 28, 22 and 20 nm node. The total number of contact holes in the logic cells is around 250. Pattern splitting for double patterning was implemented on 22 and 20 nm cells.

In the different experiments, use was made of the estimated CDU for comparison with the target CDU. CDU was estimated by lithography contour, which is extracted by Tachyon-SMO™. Simulation conditions are listed in Table 1.

TABLE 1

| Item | Sub-item | Condition |
| --- | --- | --- |
| Patterning condition | NA | 1.35 |
| | Wafer stack | Device stack |
| Mask | Film type | 6% Att. PSM |
| | MRC | 15 nm (Rectangular SRAF) |
| | | 5 nm (Free form SRAF) |
| | Mask tone | Clear field (Assuming negative tone development) |
| SMO | Resist model | Aerial image with blur |
| | SRAF | Rectangular, Free form |
| Process error Assumption | Mask CD | +/−2 nm |
| | Dose | +/−3% |
| | Focus | +/−50 nm |

The flow of the CDU estimation was as follows: At first, the source shape was defined by SRAM cell layout. On the second step, mask optimization was done with the source which was defined in the previous step. On the third step, CDs were extracted from simulated contours. The extraction was executed with and without assumed process error. Totally, 7 types of CD data sets were extracted such as (1) nominal condition, (2), (3) focus offset (+/−50 nm), (4), (5) dose offset (+/−3%) and (6), (7) mask error (+/−2 nm). Finally, CDU was estimated by calculating 3-sigma of these CDs.

Figure 8:
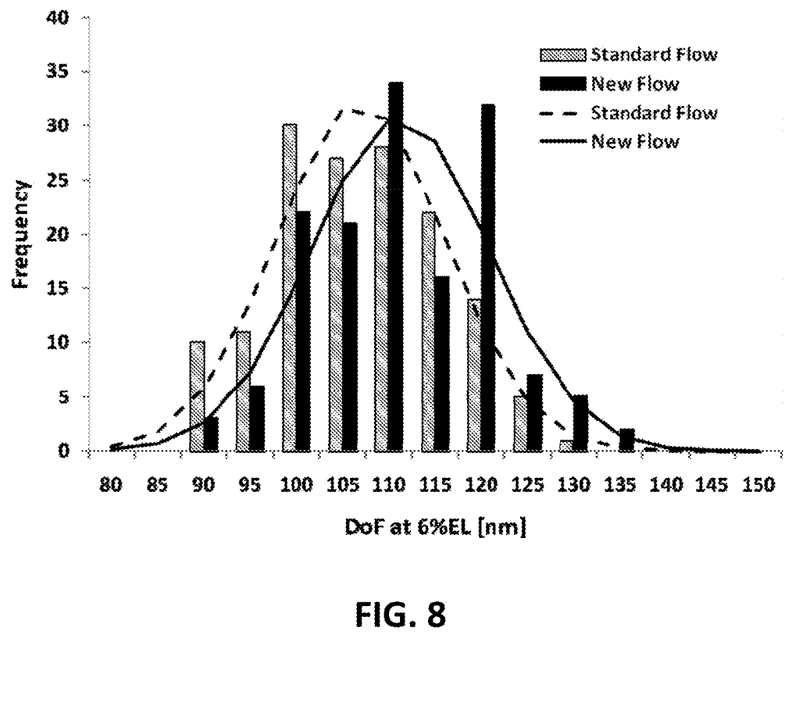
FIG. 8 shows a histogram of DoF at 6% exposure latitude (EL) in 250 contact holes of a logic layout for a conventional flow using rectangular SRAF and for a flow according to an embodiment of the present invention.

In a first experiment, a method for source-mask optimization was applied to a particular circuit layout. The DoF was first compared for the 22 nm mode for conventional flow using rectangular sub-resolution assist features and a flow according to an embodiment of the present invention. FIG. 8 shows a histogram of DoF at 6% exposure latitude (EL) in 250 contact holes of a logic layout. It can be seen that a method according to an embodiment of the present invention is clearly advantageous with regard to DoF over the conventional flow using rectangular sub-resolution assist features.

Figure 9:
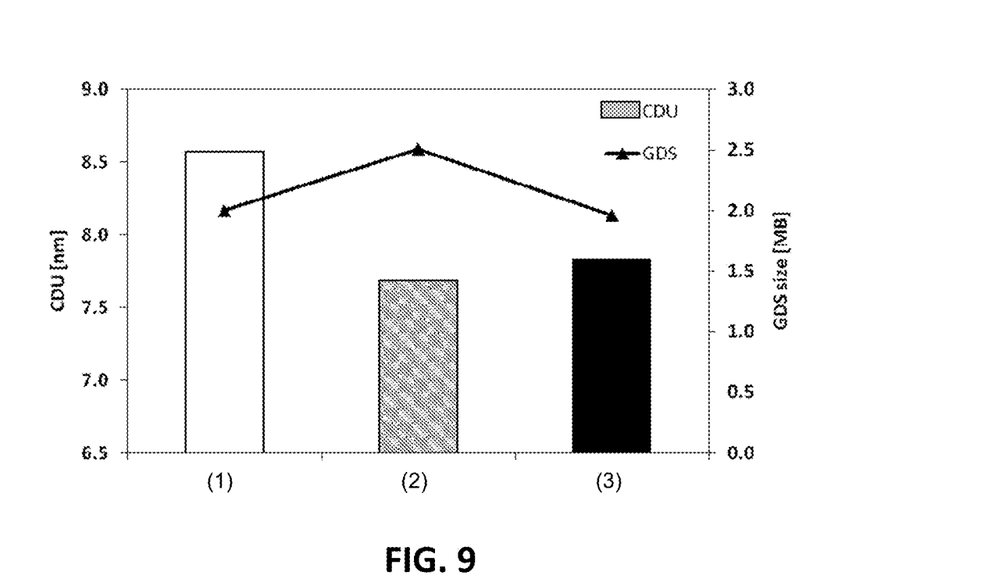
FIG. 9 illustrates the critical dimension uniformity (CDU) and the size of the GDS file for different SMO flows, illustrating advantages of embodiments according to the present invention.

Critical dimension uniformity (CDU) and the size of the GDS file were compared and shown in FIG. 9. Three types of source-mask optimization flows were evaluated: conventional flow with rectangular SRAF (1), conventional flow with non-rectangular SRAF (2) and a flow according to an embodiment of the present invention (3). FIG. 9 indicates that the flow according to an embodiment of the present invention realizes comparable level of CDU to a conventional flow with non-rectangular SRAF. More precisely, SMO optimization using a conventional flow with non-rectangular SRAF and SMO optimization using the flow according to an embodiment of the present invention offer smaller CDU performance than that of a conventional flow with rectangular SRAF by 10% and 9% respectively.

The GDS size for a flow according to an embodiment of the present invention retains at the same level as the conventional flow with rectangular SRAF. More particularly, the amounts of increase of GDS size compared with this conventional flow was found to be 25% for a conventional flow with free form SRAF and 0% for the flow according to an embodiment of the present invention. Consequently, using this flow according to an embodiment of the present invention overcomes the trade-off between CDU vs. mask complexity.

In a second experiment, a flow according to an embodiment of the present invention is tested for lithographic processing of a logic circuit at the 20 nm node.

At the 20 nm node, the CDU degradation was substantially larger than at the 22 nm. Investigation learned that a major cause was the process variability at points where pattern-splitting conflicts occurred. To solve this, besides altering of the mask layout, it was found that altering the SMO flow again resulted in an advantageous effect on CDU while limiting the GDS file size.

Figure 10:
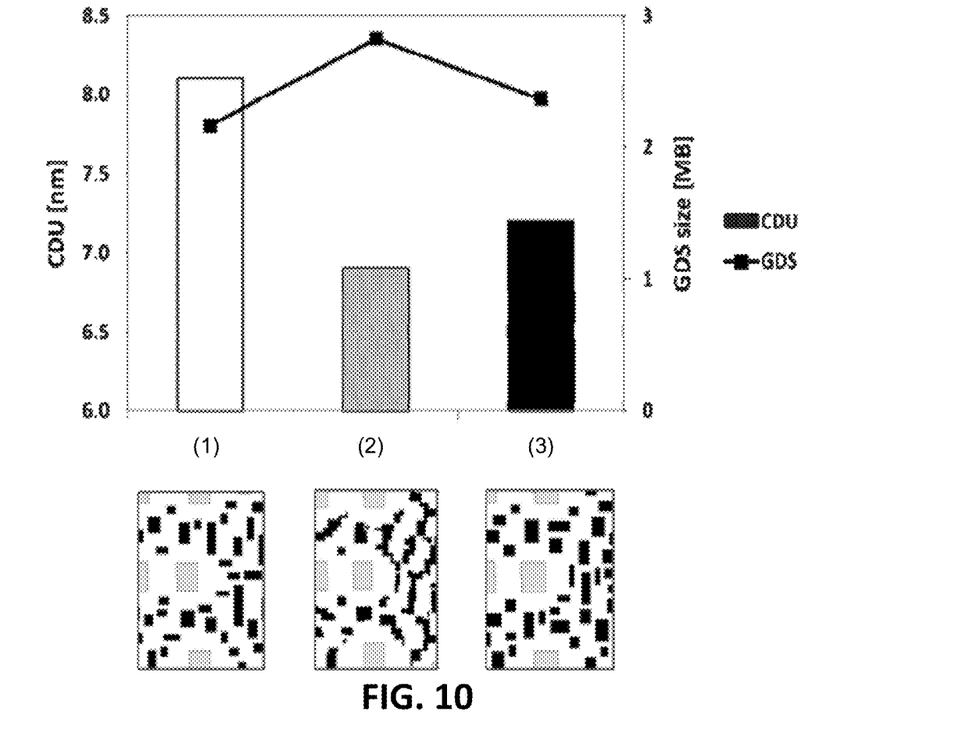
FIG. 10 illustrates, for the 20 nm node, the critical dimension uniformity (CDU) and the size of the GDS file for different SMO flows, in combination with the corresponding mask designs for the different SMO flows, illustrating advantages of embodiments according to the present invention.

In FIG. 10 the CDU and file size are shown for a conventional flow using rectangular SRAF (1), a conventional flow using non-rectangular SRAF (2) and an SMO flow according to an embodiment of the present invention (3). It can be seen in FIG. 10 that the CDU is significantly better compared to a conventional flow with rectangular SRAF while the GDS file size only slightly increased. In other words, the results obtained for the 20 nm node are similar to those obtained for the 22 nm node.

From the above examples, it can be seen that applying a source-mask optimization flow according to embodiments of the present invention results in a CDU improvement without negative impact regarding to mask manufacturability.

The invention claimed is:

1. A method for determining lithographic processing conditions for a lithographic process, the method comprising: performing using a processing system:
   obtaining characteristics of an illumination source and a mask design, the mask design comprising a lithography pattern;
   performing a first optimization for combined optimizing of at least the illumination source characteristics and the mask design characteristics for the lithographic process, whereby for the first optimization non-rectangular sub-resolution assist features for the mask are allowed;
   determining from the first optimization a set of optimized illumination source characteristics;
   performing at least one additional optimization for optimizing the mask design characteristics of the lithographic process, whereby for the at least one additional optimization the presence of non-rectangular sub-resolution assist features for the mask design is substantially excluded and whereby the at least one additional optimization takes into account the set of optimized illumination source characteristics; and
   determining from the at least one additional optimization a set of optimized mask design characteristics substantially excluding non-rectangular sub-resolution assist features.

2. A method according to claim 1, wherein performing the at least one additional optimization comprises taking into account mask rule check settings expressing at least that the most complex mask design feature allowed in the one or more further optimizations is less complex than the most complex mask design feature allowed in the first optimization.

3. A method according to claim 1, wherein the first optimization is performed on an optimization clip, being only a part of the mask design.

4. A method according to claim 1, wherein performing the at least one additional optimization comprises optimizing a threshold for the lithographic processing.

5. A method according to claim 4, wherein the at least one additional optimization comprises:
   a second optimization for optimizing a threshold and the mask design characteristics of the lithographic process, whereby for the second optimization the presence of non-rectangular sub-resolution assist features for the mask is substantially excluded and whereby the second optimization takes into account the set of optimized illumination source characteristics; and
   a third optimization for optimizing the mask design characteristics for the lithographic process, whereby for the third optimization the presence of non-rectangular sub-resolution assist features for the mask is substantially excluded and whereby the third optimization takes into account the set of optimized illumination source characteristics determined from the first optimization and an optimized threshold determined from the second optimization.

6. A method according to claim 5, wherein performing the second optimization is applied for an optimization clip, being only a part of the mask design.

7. A method according to claim 5, wherein performing the third optimization is applied for the full mask design.

8. A method according to claim 1, wherein the lithographic process comprises multiple patterning steps for patterning different portions of a pattern to be processed.

9. A method according to claim 1, wherein for the first optimization a source-mask optimization algorithm is used based on any of a full resist model or an aerial image model.

10. A method according to claim 1, wherein for the at least one additional optimization a source-mask optimization algorithm is used based on any of a full resist model or an aerial image model.

11. A system for determining lithographic processing conditions for a lithographic process, the system comprising:
   an input means for obtaining characteristics of an illumination source and a mask design, the mask design comprising a lithography pattern;
   a processing means programmed for performing a first optimization for combined optimizing of the illumination source characteristics and the mask design characteristics for the lithographic process, whereby for the first optimization non-rectangular sub-resolution assist features for the mask are allowed;
   determining from the first optimization a set of optimized illumination source characteristics;
   performing at least one additional optimization for optimizing the mask design characteristics of the lithographic process, whereby for the at least one additional optimization the presence of non-rectangular sub-resolution assist features for the mask is substantially excluded and whereby the at least one additional optimization takes into account the set of optimized illumination source characteristics; and
   determining from the at least one additional optimization a set of optimized mask design characteristics substantially excluding non-rectangular sub-resolution assist features.

12. A method of manufacturing an electronic device, the method comprising:
   determining a set of lithographic processing conditions comprising illumination source characteristics and mask characteristics by:
      obtaining characteristics of an illumination source and a mask design, the mask design comprising a lithography pattern;
      performing a first optimization for combined optimizing of at least the illumination source characteristics and the mask design characteristics for the lithographic process, whereby for the first optimization non-rectangular sub-resolution assist features for the mask are allowed;
      determining from the first optimization a set of optimized illumination source characteristics;
      performing at least one additional optimization for optimizing the mask design characteristics of the lithographic process, whereby for the at least one additional optimization the presence of non-rectangular sub-resolution assist features for the mask design is substantially excluded and whereby the at least one additional optimization takes into account the set of optimized illumination source characteristics;
      determining from the at least one additional optimization a set of optimized mask design characteristics substantially excluding non-rectangular sub-resolution assist features; and
   exposing a photoresist layer on a semiconductor substrate using the lithographic processing conditions for forming the electronic device.

* * * * *